(12) United States Patent
Haridass et al.

(10) Patent No.: US 7,868,608 B2
(45) Date of Patent: Jan. 11, 2011

(54) DETECTING OPEN GROUND CONNECTIONS IN SURFACE MOUNT CONNECTORS

(75) Inventors: Anand Haridass, Austin, TX (US);
Jesus Montanez, Austin, TX (US);
Xiaomin Shen, Pearland, TX (US);
Sungjun Chun, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 12/420,089

(22) Filed: Apr. 8, 2009

(65) Prior Publication Data

US 2010/0259289 A1      Oct. 14, 2010

(51) Int. Cl.
*G01R 31/28* (2006.01)
(52) U.S. Cl. .................................. 324/158.1; 324/538
(58) Field of Classification Search ........................ None
See application file for complete search history.

(56) References Cited

U.S. PATENT DOCUMENTS

| | | | |
|---|---|---|---|
| 4,023,073 A | | 5/1977 | Georgi |
| 5,198,756 A | * | 3/1993 | Jenkins et al. ............... 324/757 |
| 6,784,685 B2 | * | 8/2004 | Chao et al. .................. 324/765 |
| 7,307,426 B2 | | 12/2007 | Parker et al. |
| 2003/0057981 A1 | | 3/2003 | Hash |
| 2008/0155158 A1 | | 6/2008 | Yu et al. |

OTHER PUBLICATIONS

Kastensmidt, Fernanda L., et al., "Designing and Testing Fault-Tolerant Techniques for SRAM-Based FPGAs", CF '04, Apr. 14-16, 2004; pp. 419-432, Ischia, Italy; copyright 2004 ACM.
Rahmati, Ahmad, et al., "Context-for-Wireless: Context-Sensitive Energy-Efficient Wireless Data Transfer"; MobiSys '07, Jun. 11-14, 2007; pp. 165-178; San Juan, Puerto Rico; copyright 2007 ACM.

* cited by examiner

*Primary Examiner*—Ha Tran T Nguyen
*Assistant Examiner*—Arleen M Vazquez
(74) *Attorney, Agent, or Firm*—Suiter Swantz pc llo

(57) ABSTRACT

A device may include a current source for connecting to a printed circuit board. The device may also include a first FET switch pack and a second FET switch pack for connecting to the surface mount connector of the printed circuit board. Additionally, the device may include a FET controller connected to the first FET switch pack and the second FET switch pack. The FET controller may be utilized for connecting a first FET and a second FET to the first region of the surface mount connector. The FET controller may be configured for supplying the current to the first region of the surface mount connector to produce at least one continuous heat signature characteristic of an improperly connected ground pin. A thermal monitoring module may be used to identify the improper physical connection.

20 Claims, 5 Drawing Sheets

DETECTING OPEN GROUND CONNECTIONS IN SURFACE MOUNT CONNECTORS

TECHNICAL FIELD

The present disclosure generally relates to the field of printed circuit boards, and more particularly to a system and devices for detecting open ground connections in surface mount connectors.

BACKGROUND

As bus speeds for printed circuit boards increase, signal referencing becomes a greater concern. For example, an open ground pin for a surface mounted connector may result in a high frequency return current path discontinuity. Thus, when a printed circuit board is manufactured, it is often desirable to validate the connections on the printed circuit board. Consistent impedance paths should be provided along routing channels, for both the printed circuit board and its surface mounted connectors. For surface mounted connectors, an unconnected ground return pin may present a deviation in impedance that may be undetectable with a shorts test and may require a specific bit pattern as an input to the printed circuit board to reveal the deviation. The difficulty of detecting open ground pin connections may be increased by the location of signal and ground pins underneath a surface mount connector, where they are not accessible to a probe. Further, in an implementation where all ground pins for the printed circuit board are connected, either via the connector itself or via a DC connection on the printed circuit board, an open ground pin cannot be electrically isolated.

SUMMARY

A device may include a current source for connecting to a printed circuit board and providing electrical power to the printed circuit board via a mating connector. The device may also include a first Field Effect Transistor (FET) switch pack connected to a first terminal of the current source for connecting to a surface mount connector of the printed circuit board. The first FET switch pack may include a first group of FETs. Further, the device may include a second FET switch pack connected to a second terminal of the current source for connecting to the surface mount connector of the printed circuit board. The second FET switch pack may include a second group of FETs. Additionally, the device may include a FET controller connected to the first FET switch pack and the second FET switch pack. The FET controller may be utilized for connecting a first FET of the first plurality of FETs to a first region of the surface mount connector and connecting a second FET of the second plurality of FETs to the first region of the surface mount connector to supply current to the first region of the surface mount connector. The FET controller may be configured for supplying the current to the first region of the surface mount connector to produce at least one continuous heat signature characteristic of a property connected component.

A device may include a current source for connecting to a printed circuit board and providing electrical power to the printed circuit board. The device may also include a first Field Effect Transistor (FET) switch pack connected to a first terminal of the current source for connecting to a surface mount connector of the printed circuit board. The first FET switch pack may include a first group of FETs. Further, the device may include a second FET switch pack connected to a second terminal of the current source for connecting to the surface mount connector of the printed circuit board. The second FET switch pack may include a second group of FETs. Additionally, the device may include a FET controller connected to the first FET switch pack and the second FET switch pack. The FET controller may be utilized for connecting a first FET of the first plurality of FETs to a first region of the surface mount connector and connecting a second FET of the second plurality of FETs to the first region of the surface mount connector to supply current to the first region of the surface mount connector. Still further, the device may include a thermal monitoring module for monitoring the first region of the surface mount connector to identify at least one continuous heat signature characteristic of a property connected component.

A system may include a current source for connecting to a printed circuit board and providing electrical power to the printed circuit board. The system may also include a first Field Effect Transistor (FET) switch pack connected to a first terminal of the current source for connecting to a surface mount connector of the printed circuit board. The first FET switch pack may include a first group of FETs. Further, the system may include a second FET switch pack connected to a second terminal of the current source for connecting to the surface mount connector of the printed circuit board. The second FET switch pack may include a second group of FETs. Additionally, the system may include a FET controller connected to the first FET switch pack and the second FET switch pack. The FET controller may be utilized for connecting a first FET of the first plurality of FETs to a first region of the surface mount connector and connecting a second FET of the second plurality of FETs to the first region of the surface mount connector to supply current to the first region of the surface mount connector. Still further, the system may include a means for monitoring the first region of the surface mount connector to identify at least one heat signature characteristic of an improperly connected component.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
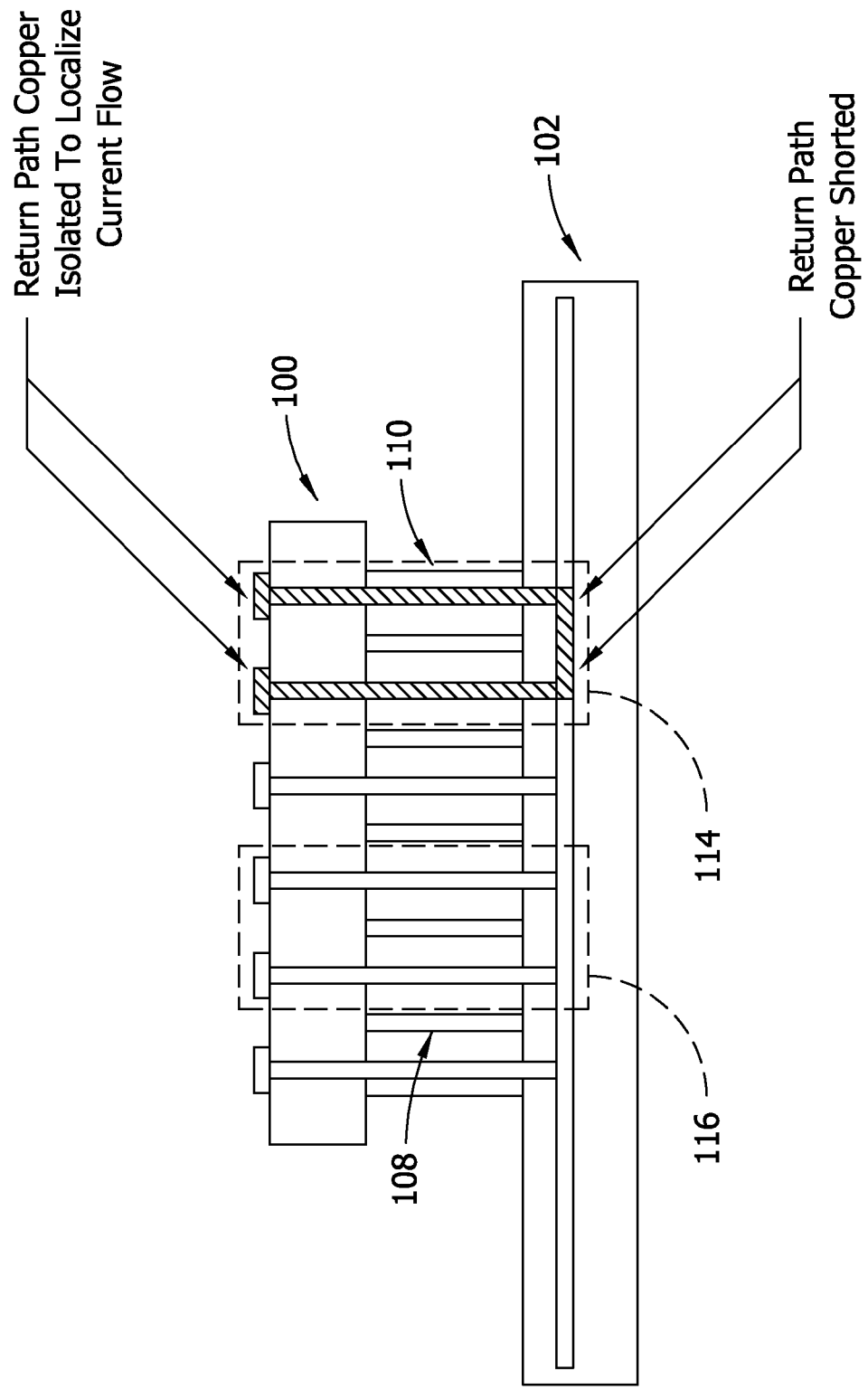
FIG. 1 is a partial cross-sectional side elevation view illustrating a load test card connected to a card under test in accordance with the present disclosure.
Figure 2:
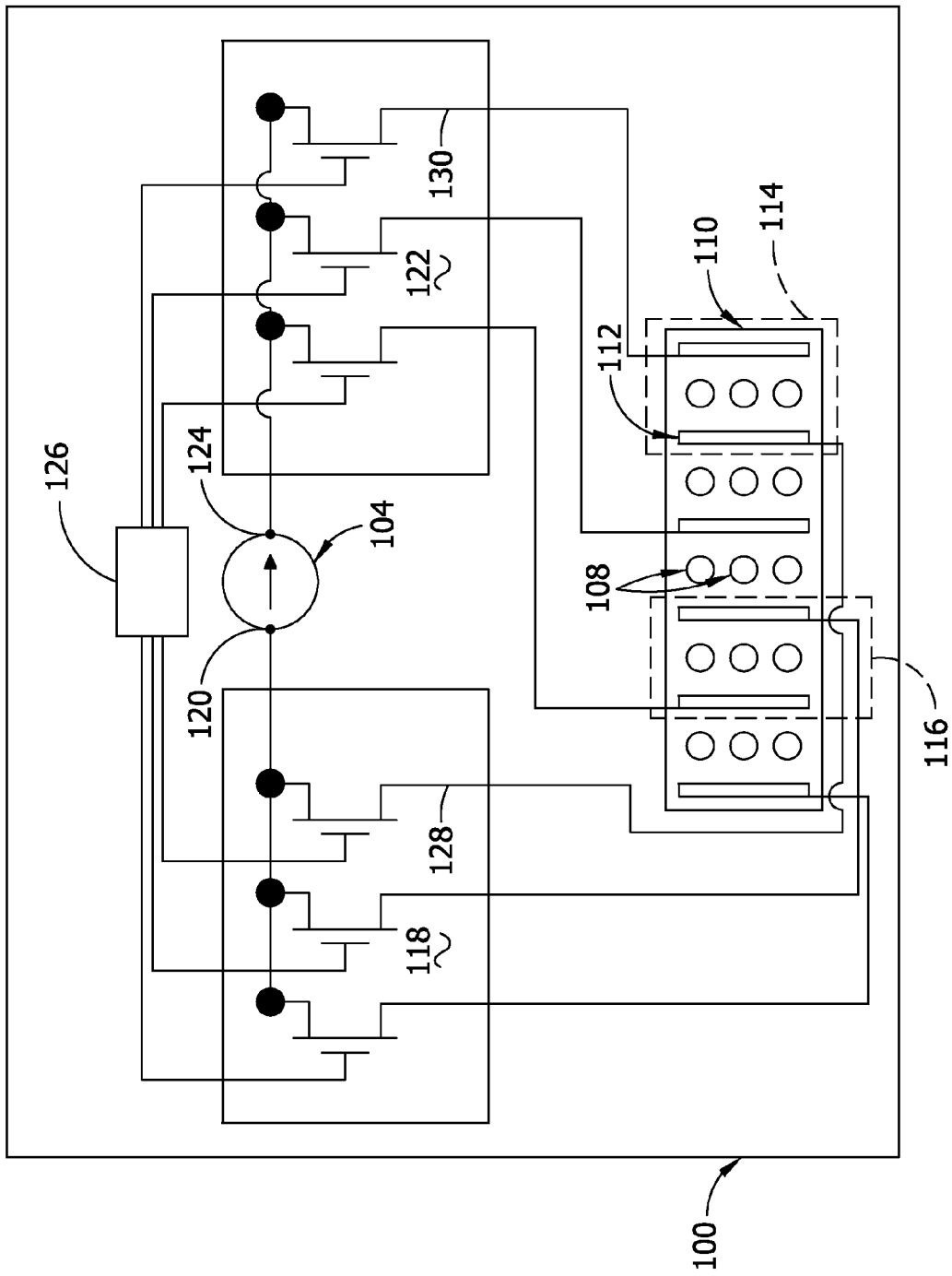
FIG. 2 is a top plan view illustrating a load test card connected to a surface mount connector in accordance with the present disclosure.
Figure 3:
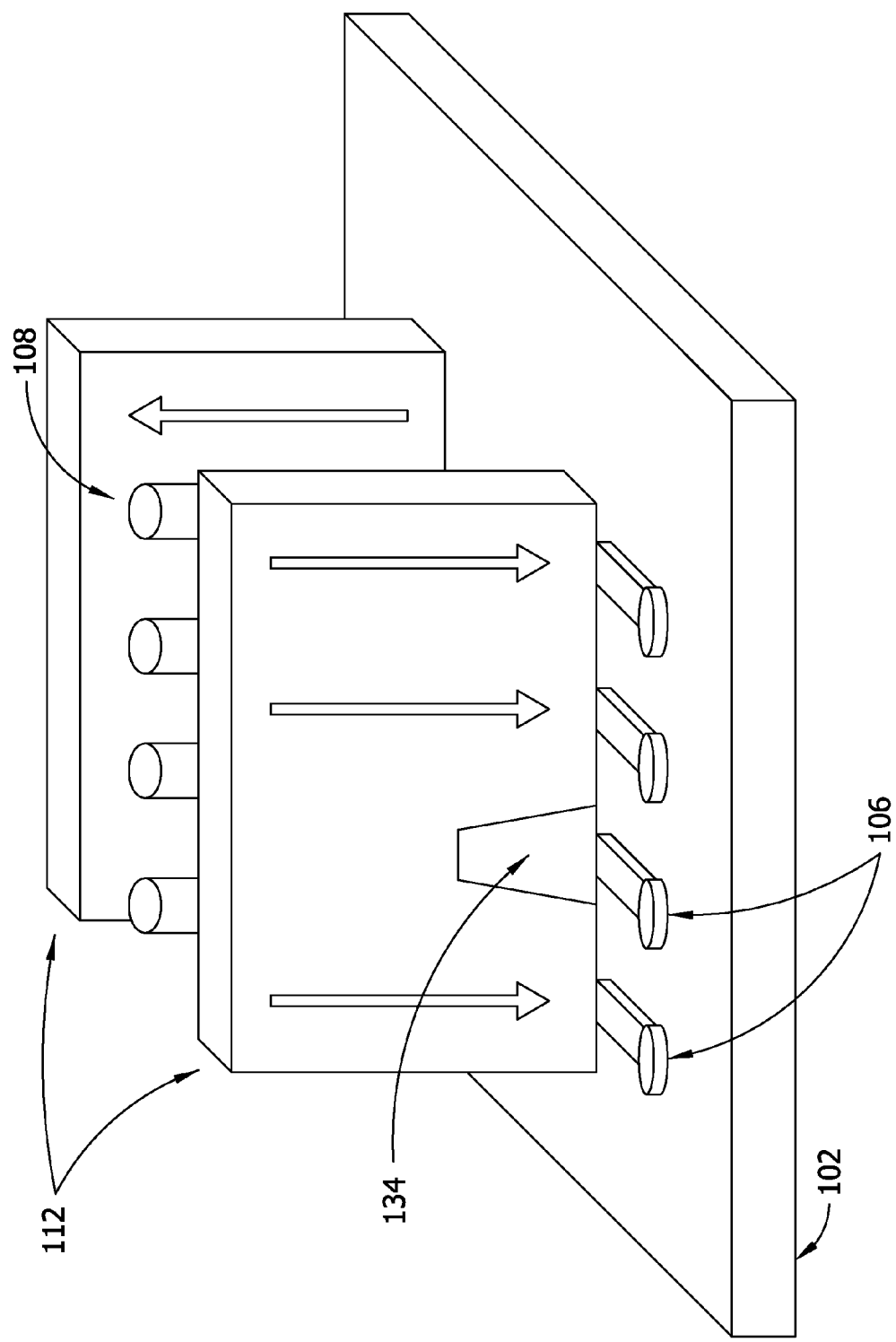
FIG. 3 is a partial isometric view illustrating a connector region for a card under test in accordance with the present disclosure.

Referring now to FIGS. 1 through 3, a load test card 100 is described in accordance with the present disclosure. The load test card 100 may comprise a printed circuit board, or the like, for connecting to another card and testing for open component connections (e.g., open ground pins) in surface mount connectors. For example, the load test card 100 may be connected to a printed circuit board, such as a card under test 102. The card under test 102 may include a substrate with an electric circuit superimposed thereupon. The electric circuit may include connections formed of metal strips (e.g., copper) comprising a conductive pathway in a pattern typically produced utilizing silk screen printing, photoengraving, PCB Milling, and/or electroplating. For instance, the electric circuit may include traces etched from a copper sheet and laminated onto the substrate. Electronic components may be fixed to the substrate and connected to the electric circuit with solder. Component leads and integrated circuit pins may pass through holes (vias) in the board, or, alternatively, they may be surface mounted. The printed circuit board may include components mounted on one or both sides, as well as internal signal layers, which allow more connections within the same board area.

The load test card 100 includes a current source 104 for connecting to the card under test 102 and providing electrical power to the card under test 102. For example, the load test card 100 may be utilized to inject a localized DC current to one or more ground pins 106 immediately surrounding one or more signal pins 108. It is contemplated that power may be provided to the card under test 102 via a mating connector. In one embodiment, the load test card 100 may mate with a subset of the ground pins 106 of a surface mount connector 110 under test. This may be accomplished by isolating the ground return current paths of the card under test 102, which may be commoned together within a layer stackup into different regions on the load test card 100. For example, the current source 104 may be connected to the ground pins 106 via one or more ground conductors 112 for current entry and return. The ground conductors 112 may be included as part of the surface mount connector 110 under test, and the load test card 100 mates with the surface mount connector 110. The mating connector on the load test card 100 may be wired so that the ground copper is not shorted on its layer stackup. This configuration may effectively separate the ground return for the surface mount connector 110 into different regions on the load test card 100 (see especially the first region 114 and the second region 116 of the load test card 100 and the surface mount connector 110 shown on FIG. 1).

The load test card 100 includes a first Field Effect Transistor (FET) switch pack 118 connected to a first terminal 120 of the current source 104 and a second FET switch pack 122 connected to a second terminal 124 of the current source 104. The first FET switch pack 118 and the second FET switch pack 122 are for connecting to the surface mount connector 110 of the card under test 102. The first FET switch pack 118 includes a first group of FETs, and the second FET switch pack 122 includes a second group of FETs. One FET switch in the first FET switch pack 118 may be utilized to provide current to the card under test 102, and another FET switch in the second FET switch pack 122 may be utilized for current return. For example, a selected FET switch from the first FET switch pack 118 and a selected FET switch from the second FET switch pack 122 may be connected to the ground conductors 112 of the surface mount connector 110.

The load test card 100 includes a FET controller 126 connected to the first FET switch pack 118 and the second FET switch pack 122. The FET controller 126 may be utilized for supplying current to and from different regions of the card under test 102, allowing DC current to sweep through the surface mount connector 110 in a controlled fashion. For example, the FET controller 126 may be utilized for connecting a first FET 128 of the first group of FETs to the first region 114 of the surface mount connector 110. The FET controller 126 is also configured for connecting a second FET 130 of the second group of FETs to the first region 114 of the surface mount connector 110. The first FET 128 and the second FET 130 may be utilized to supply current to the first region 114 of the surface mount connector 110. Alternatively, a third FET selected from the first FET switch pack 118 and a fourth FET selected from the second FET switch pack 122 may be utilized to supply current to the second region 116 of the surface mount connector 110.

As the electrical current enters and returns from the card under test 102, traces and vias along the various pin connections may begin to heat. For example, DC current may be utilized to heat copper traces and vias in either the first region 114 or the second region 116 of the surface mount connector 110. When a proper connection is present, a constant DC current may flow through the connection, giving off a continuous heat signature characteristic of a property connected component. However, where a poor connection exists (e.g., in the case of an improperly connected/open ground pin), little or no DC current will flow, leading to a cold spot 134 (as illustrated in FIG. 3). A thermal scan may be able to detect the cold spot 134, indicating the poor connection. For example, a thermal monitoring module 136, such as an infrared film camera, a digital camera sensitive to infrared radiation, a thermographic imaging device, or another device suitable for monitoring thermal variations in materials may be utilized to identify the cold spot 134.

In one embodiment, the cold spot 134 may be identified by comparing the thermal energy dissipating from that region to a continuous heat signature characteristic of a property connected pin. For example, identifying one or more property connected ground pins and determining a characteristic heat signature for the ground pins may enable the detection of an improperly connected ground pin via its lower relative heat signature. Alternatively, the cold spot 134 may be identified by its own heat signature (e.g., a ground pin 106 may radiate an amount of heat within a range indicative of a poor connection). In one instance, the load test card 100 may be utilized to identify one or more improperly connected ground pins in the first region 114 of the surface mount connector 110. In another instance, the load test card 100 may be utilized to identify one or more improperly connected ground pins in the second region 116 of the surface mount connector 110.

Figure 4:
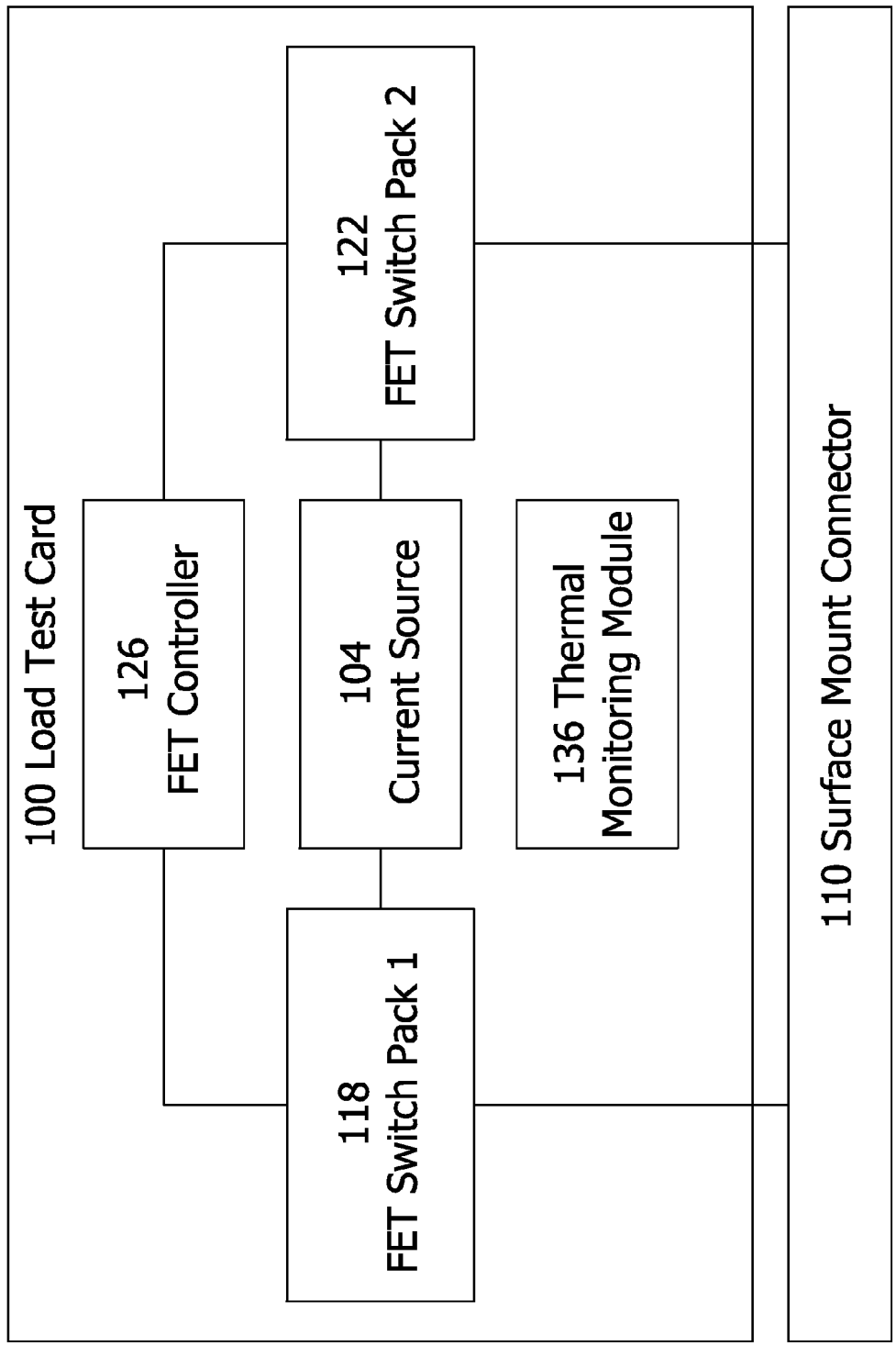
FIG. 4 is a block diagram illustrating a load test card connected to a surface mount connector in accordance with the present disclosure.
Figure 5:
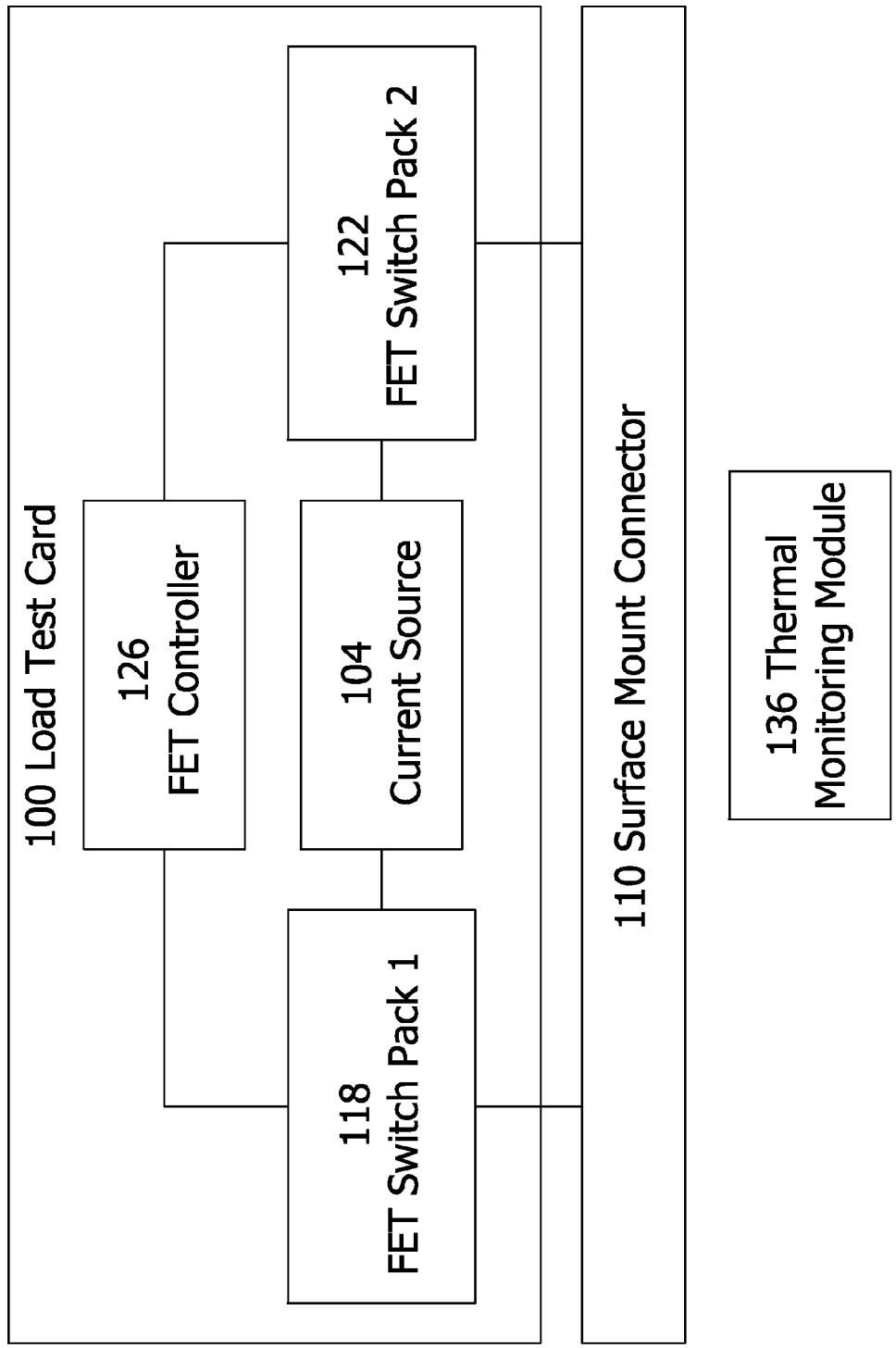
FIG. 5 is a block diagram illustrating a load test card connected to a surface mount connector and a thermal monitoring module in accordance with the present disclosure.

Referring now to FIGS. 4 and 5, in one embodiment, the load test card 100 may include the thermal monitoring module 136. In another embodiment, the thermal monitoring module 136 may be external to the load test card 100. In either case, the thermal monitoring module 136 may be utilized to detect one or more of a continuous heat signature characteristic of a property connected component or a heat signature characteristic of an improperly connected component. Further, while detecting open ground pins has been described with some specificity, this description is intended to be explanatory and not restrictive of the present disclosure. Moreover, it is contemplated that the systems, device, and/or techniques described herein may be utilized to detect other improperly connected components, including traces, component leads, vias, and/or signal layers.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A device, comprising:
   a current source for connecting to a printed circuit board and providing electrical power to the printed circuit board;
   a first Field Effect Transistor (FET) switch pack connected to a first terminal of the current source for connecting to a surface mount connector of the printed circuit board, the first FET switch pack comprising a first plurality of FETs;
   a second FET switch pack connected to a second terminal of the current source for connecting to the surface mount connector of the printed circuit board, the second FET switch pack comprising a second plurality of FETs; and
   a FET controller connected to the first FET switch pack and the second FET switch pack for connecting a first FET of the first plurality of FETs to a first region of the surface mount connector and connecting a second FET of the second plurality of FETs to the first region of the surface mount connector to supply current to the first region of the surface mount connector,
   wherein the FET controller is configured for supplying the current to the first region of the surface mount connector to produce at least one continuous heat signature characteristic of a property connected component.

2. The device of claim 1, wherein the current source comprises a Direct Current (DC) current source.

3. The device of claim 1, wherein the FET controller is configured for connecting a third FET of the first plurality of FETs to a second region of the surface mount connector and connecting a fourth FET of the second plurality of FETs to the second region of the surface mount connector to supply current to the second region of the surface mount connector.

4. The device of claim 3, wherein the FET controller is configured for supplying the current to the second region of the surface mount connector to produce at least a second continuous heat signature characteristic of a property connected component.

5. The device of claim 1, wherein the first continuous heat signature characteristic of the property connected component is distinct from a heat signature characteristic of an improperly connected component.

6. The device of claim 5, wherein the heat signature characteristic of the improperly connected component is characteristic of an open ground pin.

7. The device of claim 1, wherein the property connected component is proximal to at least one signal pin.

8. A device, comprising:
   a current source for connecting to a printed circuit board and providing electrical power to the printed circuit board;
   a first Field Effect Transistor (FET) switch pack connected to a first terminal of the current source for connecting to a surface mount connector of the printed circuit board, the first FET switch pack comprising a first plurality of FETs;
   a second FET switch pack connected to a second terminal of the current source for connecting to the surface mount connector of the printed circuit board, the second FET switch pack comprising a second plurality of FETs;
   a FET controller connected to the first FET switch pack and the second FET switch pack for connecting a first FET of the first plurality of FETs to a first region of the surface mount connector and connecting a second FET of the second plurality of FETs to the first region of the surface mount connector to supply current to the first region of the surface mount connector; and
   a thermal monitoring module for monitoring the first region of the surface mount connector to identify at least one continuous heat signature characteristic of a property connected component.

9. The device of claim 8, wherein the current source comprises a Direct Current (DC) current source.

10. The device of claim 8, wherein the FET controller is configured for connecting a third FET of the first plurality of FETs to a second region of the surface mount connector and connecting a fourth FET of the second plurality of FETs to the second region of the surface mount connector to supply current to the second region of the surface mount connector.

11. The device of claim 10, wherein the thermal monitoring module is configured for monitoring the second region of the surface mount connector to identify at least a second continuous heat signature characteristic of a property connected component.

12. The device of claim 8, wherein the first continuous heat signature characteristic of the property connected component is distinct from a heat signature characteristic of an improperly connected component.

13. The device of claim 12, wherein the heat signature characteristic of the improperly connected component is characteristic of an open ground pin.

14. The device of claim 8, wherein the property connected component is proximal to at least one signal pin.

15. A system, comprising:
   a current source for connecting to a printed circuit board and providing electrical power to the printed circuit board;
   a first Field Effect Transistor (FET) switch pack connected to a first terminal of the current source for connecting to a surface mount connector of the printed circuit board, the first FET switch pack comprising a first plurality of FETs;
   a second FET switch pack connected to a second terminal of the current source for connecting to the surface mount connector of the printed circuit board, the second FET switch pack comprising a second plurality of FETs;
   a FET controller connected to the first FET switch pack and the second FET switch pack for connecting a first FET of the first plurality of FETs to a first region of the surface mount connector and connecting a second FET of the second plurality of FETs to the first region of the surface mount connector to supply current to the first region of the surface mount connector; and means for monitoring the first region of the surface mount connector to identify at least one heat signature characteristic of an improperly connected component.

16. The system of claim 15, wherein the current source comprises a Direct Current (DC) current source.

17. The system of claim 15, wherein the FET controller is configured for connecting a third FET of the first plurality of FETs to a second region of the surface mount connector and connecting a fourth FET of the second plurality of FETs to the second region of the surface mount connector to supply current to the second region of the surface mount connector.

18. The system of claim 17, wherein monitoring means is configured for monitoring the second region of the surface mount connector to identify at least a second heat signature characteristic of an improperly connected component.

19. The system of claim 15, wherein the heat signature characteristic of the improperly connected component is distinct from a continuous heat signature characteristic of a property connected component.

20. The system of claim 15, wherein the heat signature characteristic of the improperly connected component is characteristic of an open ground pin.

* * * * *